(12) United States Patent
Jeong et al.

(10) Patent No.: US 11,018,121 B2
(45) Date of Patent: May 25, 2021

(54) SEMICONDUCTOR PACKAGES

(71) Applicant: Samsung Electronics Co., Ltd., Suwon-si (KR)

(72) Inventors: Sangnam Jeong, Hwaseong-si (KR); IlJoon Kim, Seoul (KR); SunWon Kang, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/438,430

(22) Filed: Jun. 11, 2019

(65) Prior Publication Data

US 2019/0295999 A1    Sep. 26, 2019

Related U.S. Application Data

(63) Continuation of application No. 15/867,686, filed on Jan. 10, 2018, now Pat. No. 10,797,030.

(30) Foreign Application Priority Data

Jun. 19, 2017    (KR) .................. 10-2017-0077432

(51) Int. Cl.
*H01L 25/16*    (2006.01)
*H01L 23/00*    (2006.01)
(Continued)

(52) U.S. Cl.
CPC ............ *H01L 25/16* (2013.01); *H01L 23/481* (2013.01); *H01L 23/50* (2013.01); *H01L 23/5223* (2013.01); *H01L 23/5383* (2013.01); *H01L 23/5384* (2013.01); *H01L 24/06* (2013.01); *H01L 24/08* (2013.01); *H01L 24/17* (2013.01); *H01L 23/49816* (2013.01); *H01L 23/5385* (2013.01); *H01L 24/13* (2013.01);
(Continued)

(58) Field of Classification Search
CPC . H01L 2924/19104; H01L 2924/19041; H01L 23/642; H01L 23/5223; H01L 2924/19105
See application file for complete search history.

(56) References Cited

U.S. PATENT DOCUMENTS 7,598,618 B2    10/2009    Shiraishi
8,350,382 B2    1/2013    Fürgut et al.
(Continued)

FOREIGN PATENT DOCUMENTS

JP    2014216509 A    11/2014
KR    20140084518 A    7/2014
WO    2016162938 A1    10/2016

*Primary Examiner* — Samuel A Gebremariam
*Assistant Examiner* — Jonas T Beardsley
(74) *Attorney, Agent, or Firm* — Renaissance IP Law Group LLP

(57) ABSTRACT

Disclosed is a semiconductor package including a semiconductor chip, a first outer capacitor on the semiconductor chip including a first electrode and a second electrode, a second outer capacitor on the semiconductor chip including a first electrode pattern and a second electrode pattern, and a conductive pattern on the semiconductor chip and electrically connected to the first electrode of the first outer capacitor and the first electrode pattern of the second outer capacitor. The second electrode of the first outer capacitor is insulated from the second electrode pattern of the second outer capacitor.

19 Claims, 10 Drawing Sheets

(51) Int. Cl.
*H01L 23/522* (2006.01)
*H01L 23/48* (2006.01)
*H01L 23/538* (2006.01)
*H01L 23/50* (2006.01)
*H01L 23/498* (2006.01)

(52) U.S. Cl.
CPC .............. *H01L 24/14* (2013.01); *H01L 24/16* (2013.01); *H01L 2224/0603* (2013.01); *H01L 2224/0616* (2013.01); *H01L 2224/06051* (2013.01); *H01L 2224/08265* (2013.01); *H01L 2224/13025* (2013.01); *H01L 2224/13101* (2013.01); *H01L 2224/1412* (2013.01); *H01L 2224/14181* (2013.01); *H01L 2224/16145* (2013.01); *H01L 2224/16146* (2013.01); *H01L 2224/16225* (2013.01); *H01L 2224/17181* (2013.01); *H01L 2924/15174* (2013.01); *H01L 2924/15311* (2013.01); *H01L 2924/19041* (2013.01); *H01L 2924/19104* (2013.01)

(56) References Cited

U.S. PATENT DOCUMENTS

| | | | |
|---|---|---|---|
| 9,064,860 | B1 | 6/2015 | Liou et al. |
| 9,397,073 | B1 | 7/2016 | England |
| 9,559,003 | B2 | 1/2017 | Law et al. |
| 9,653,421 | B2 | 5/2017 | Hattori |
| 2007/0216020 | A1 | 9/2007 | Shiraishi |
| 2008/0206927 | A1 | 8/2008 | Graydon et al. |
| 2008/0258259 | A1* | 10/2008 | Osaka .................... H01L 24/73 257/532 |
| 2009/0079065 | A1 | 3/2009 | Furgut et al. |
| 2010/0123215 | A1 | 5/2010 | Pan et al. |
| 2015/0243585 | A1 | 8/2015 | Umemoto |
| 2015/0249068 | A1 | 9/2015 | Ye |
| 2015/0318242 | A1* | 11/2015 | Li .................... H01L 23/49575 257/296 |
| 2015/0357240 | A1 | 12/2015 | Law et al. |
| 2016/0233195 | A1 | 8/2016 | Nagai |
| 2017/0040278 | A1 | 2/2017 | Hattori |

* cited by examiner

SEMICONDUCTOR PACKAGES

CROSS-REFERENCE TO RELATED APPLICATIONS

This application is a continuation of U.S. patent application Ser. No. 15/867,686, filed on Jan. 10, 2018, which claims priority under 35 U.S.C § 119 of Korean Patent Application No. 10-2017-0077432 filed on Jun. 19, 2017, the disclosure of which is incorporated by reference herein in its entirety.

BACKGROUND

Embodiments of the present inventive concept relate to a semiconductor package, and more particularly, to a semiconductor package including a capacitor.

For high integration of semiconductor devices, a method for stacking a plurality of semiconductor chips has been proposed where a multi-chip package has a plurality of semiconductor chips mounted in a single semiconductor package or a system-in package in which stacked different chips operate as one system. For high performance semiconductor devices, power integrity enhancement is required. Power integrity (PI) may be evaluated by analyzing whether the desired power/current is desirably transmitted from source to integrated circuits. Research is being conducted to improve power integrity by filtering noise of power voltage or ground voltage of semiconductor devices.

SUMMARY

Some embodiments of the present inventive concepts provide a semiconductor package having enhanced power integrity.

An object of the present inventive concepts is not limited to the above-mentioned one; other objects which have not been mentioned above will be clearly understood to those skilled in the art from the following description.

According to an exemplary embodiment of the present inventive concept, a semiconductor package may comprise: a semiconductor chip; a first outer capacitor on the semiconductor chip including a first electrode and a second electrode; a second outer capacitor on the semiconductor chip including a first electrode pattern and a second electrode pattern; and a conductive pattern on the semiconductor chip and electrically connected to the first electrode of the first outer capacitor and the first electrode pattern of the second outer capacitor. The second electrode of the first outer capacitor may be insulated from the second electrode pattern of the second outer capacitor.

According to an exemplary embodiment of the present inventive concept, a semiconductor package may comprise: a semiconductor chip; a first metal pattern and a second metal pattern that are disposed on the semiconductor chip and are electrically insulated from each other; a conductive pattern on the semiconductor chip; a first outer capacitor on the semiconductor chip; and a second outer capacitor on the semiconductor chip. A first electrode of the first outer capacitor may be electrically connected through the conductive pattern to a first electrode pattern of the second outer capacitor. A second electrode of the first outer capacitor may be electrically connected to the first metal pattern. A second electrode pattern of the second outer capacitor may be electrically connected to the second metal pattern.

According to an exemplary embodiment of the present inventive concept, a semiconductor package may comprise: a plurality of stacked semiconductor chips; a plurality of outer capacitors spaced apart from each other and each including a first electrode and a second electrode; and a ground pattern on the semiconductor chips electrically connected to the first electrodes of the outer capacitors. The second electrodes of the outer capacitors comprise a first power electrode and a second power electrode electrically connected to a power terminal different from that of the first power electrode.

DETAILED DESCRIPTION OF EMBODIMENTS

Herein a semiconductor package and a semiconductor module comprising the same are described according to the present inventive concepts.

Figure 1A:
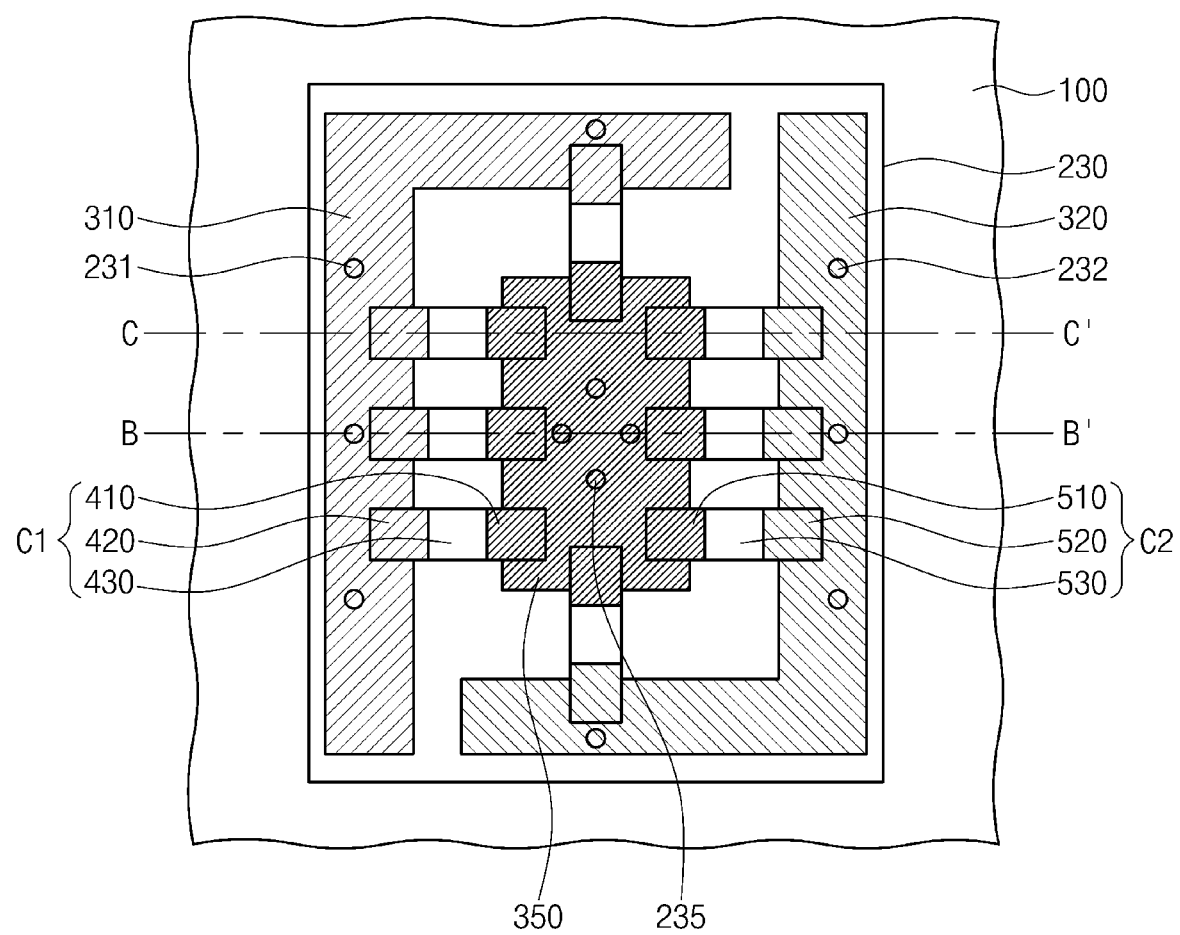
FIG. 1A illustrates a plan view showing a semiconductor package according to an exemplary embodiment of the present inventive concept.
Figure 1B:
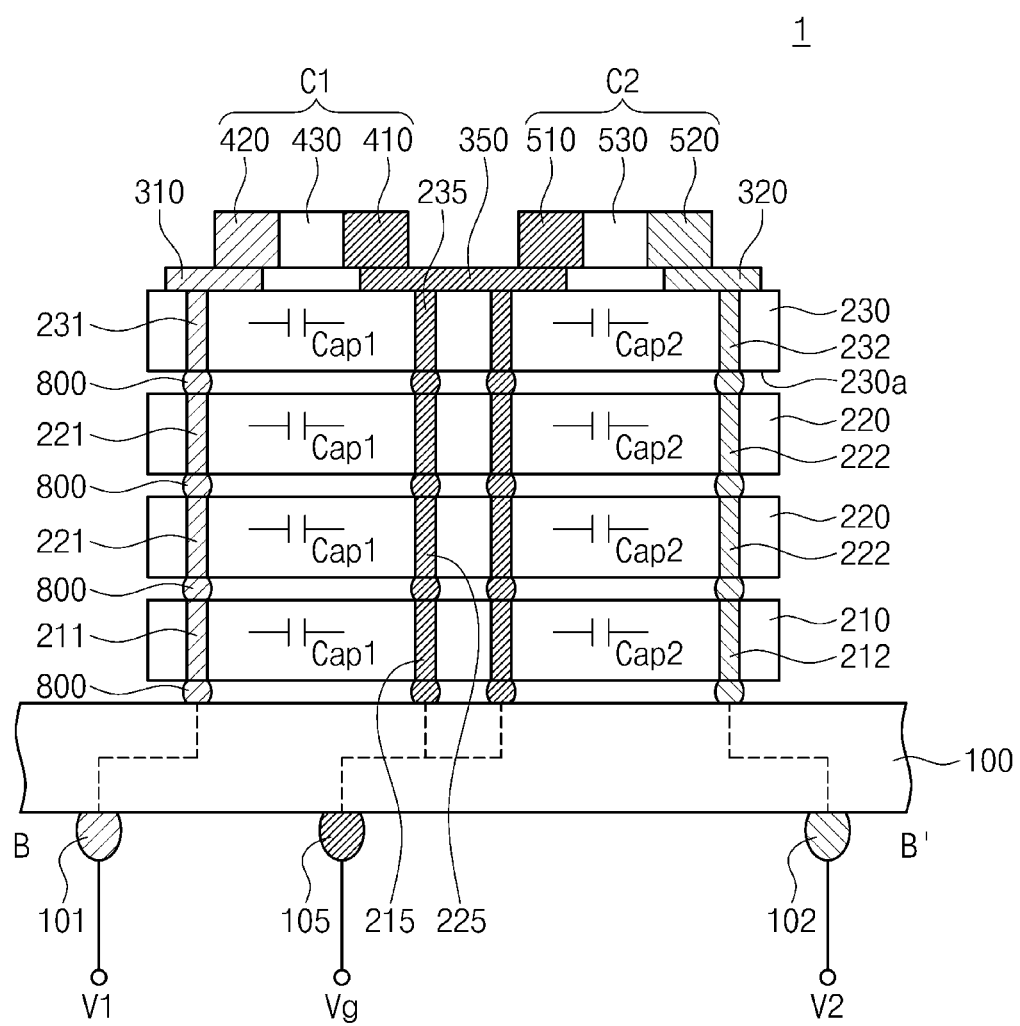
FIG. 1B illustrates a cross-sectional view taken along line B-B' of FIG. 1A.
Figure 1C:
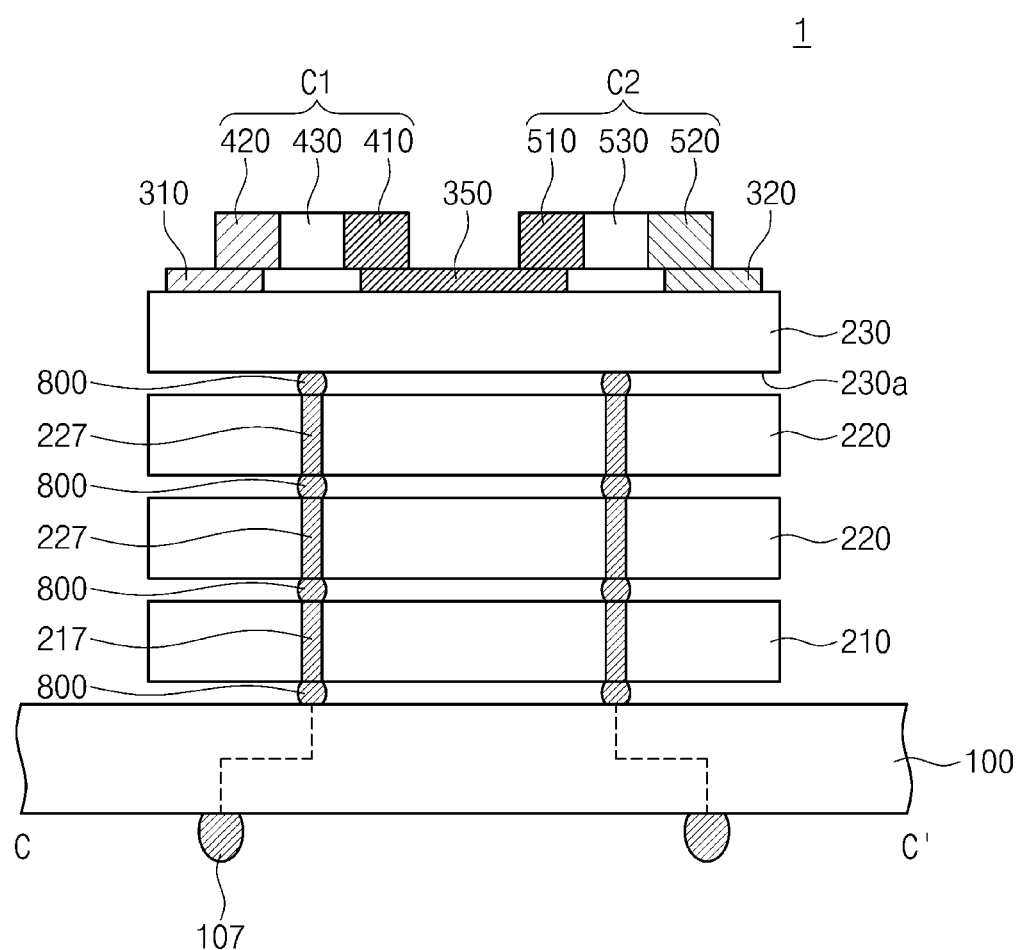
FIG. 1C illustrates a cross-sectional view taken along line C-C' of FIG. 1A.

FIG. 1A illustrates a plan view showing a semiconductor package according to an exemplary embodiment of the present inventive concept. FIG. 1B illustrates a cross-sectional view taken along line B-B' of FIG. 1A. FIG. 1C illustrates a cross-sectional view taken along line C-C' of FIG. 1A.

Referring to FIGS. 1A to 1C, a semiconductor package 1 may include a substrate 100, a first semiconductor chip 210, a second semiconductor chip 220, a third semiconductor chip 230; first and second outer capacitors C1 and C2; a first power pattern 310; a second power pattern 320; and a ground pattern 350. The substrate 100 may include a printed circuit board (PCB), a silicon substrate, or the like. A bottom surface of the substrate 100 may be provided thereon with a first power terminal 101, a second power terminal 102, a ground terminal 105, and a signal terminal 107. A first power voltage V1 may be applied to the first power terminal 101. The first power voltage V1 may be an output voltage Vdd for buffer or core logic circuits of the first semiconductor chip 210, the second semiconductor chip 220, and the third semiconductor chip 230. A second power voltage V2 may be applied to the second power terminal 102. The second power voltage V2 may be an output buffer voltage Vddq of the first semiconductor chip 210, the second semiconductor chip 220, and the third semiconductor chip 230. The second power voltage V2 may be different from the first power voltage V1. For example, the first and second power voltages V1 and V2 may be positive voltages, and the second power voltage V2 may be greater than the first power voltage V1. A ground voltage Vg may be applied to the ground terminal 105.

The first, second and third semiconductor chips 210, 220, and 230, respectively, may be stacked on the substrate 100. The first semiconductor chip 210 may include a logic circuit, a memory circuit, or the like or a combination thereof. The first semiconductor chip 210 may act as a controller chip, but is not limited thereto. The first semiconductor chip 210 may include a first lower power via 211, a second lower power via 212, a lower ground via 215, and a lower signal via 217. The first semiconductor chip 210 may be penetrated with the first lower power via 211, the second lower power via 212, the lower ground via 215, and the lower signal via 217. The first lower power via 211, the second lower power via 212, the lower ground via 215, and the lower signal via 217 may each include a conductive material such as copper, aluminum, tungsten, titanium, tantalum, or the like or an alloy thereof. As illustrated in dotted line, the first lower power via 211 may be connected to the first power terminal 101 and may thus act as a supply path of the first power voltage V1. In this description, the phrase "electrically connected/coupled" includes a meaning of indirectly connected/coupled through other conductive components as well as directly connected/coupled. In FIGS. 1B, 1C, 1D, 2B, 2C, 3B, and 3C, a dotted line in the substrate 100 may conceptually indicate flow paths of voltages or electrical signals. The flow paths may be variously modified. The second lower power via 212 may be insulated from the first lower power via 211. The second lower power via 212 may be connected to the second power terminal 102 and may thus act as a supply path of the second power voltage V2. The second power voltage V2 may be supplied through the second lower power via 212 to the second semiconductor chip 220 and third semiconductor chip 230. The lower ground via 215 may be disposed between the first lower power via 211 and the second lower power via 212. The lower ground via 215 may be connected to the ground terminal 105 and may thus be applied to the ground voltage Vg. The lower ground via 215 may be insulated from the first lower power via 211 and second lower power via 212.

The first semiconductor chip 210 may be provided therein with a first inner capacitor Cap1 and a second inner capacitor Cap2. Although not shown, the first inner capacitor Cap1 may include a first terminal and a second terminal that are spaced apart from each other. The first terminal may be electrically connected to the lower ground via 215, and the second terminal may be electrically connected to the first lower power via 211. An insulation layer may be provided between the first terminal and the second terminal. The first power voltage V1 and the ground voltage Vg may be applied to integrated circuits (not shown) of the first semiconductor chip 210. In this case, the first power voltage V1 and the ground voltage Vg may be voltage-noise filtered by the first inner capacitor Cap1, and may then be applied to the integrated circuits of the first semiconductor chip 210. For example, the first inner capacitor Cap1 may be used to achieve a decoupling circuit that prevents noise generated in one part of a semiconductor device from affecting other part of the semiconductor device.

The second inner capacitor Cap2 may include a first electrode terminal and a second electrode terminal that are spaced apart from each other. The first electrode terminal may be electrically connected to the lower ground via 215, and the second electrode terminal may be electrically connected to the second lower power via 212. An insulation layer may be provided between the first electrode terminal and the second electrode terminal. The second power voltage V2 may be applied to the integrated circuits of the first semiconductor chip 210. In this case, the second power voltage V2 and the ground voltage Vg may be voltage-noise filtered by the second inner capacitor Cap2, and may then be applied to the integrated circuits of the first semiconductor chip 210. For example, the second inner capacitor Cap2 may be used to achieve a decoupling circuit.

The second semiconductor chip 220 may include a first intermediate power via 221, a second intermediate power via 222, an intermediate ground via 225, and an intermediate signal via 227. The first intermediate power via 221, the second intermediate power via 222, the intermediate ground via 225, and the intermediate signal via 227 of the second semiconductor chip 220 may each include a conductive material such as copper, aluminum, tungsten, titanium, tantalum, or the like or an alloy thereof. The first intermediate power via 221, the second intermediate power via 222, and the intermediate ground via 225 of the second semiconductor chip 220 may be respectively electrically connected to the first lower power via 211, the second lower power via 212, and the lower ground via 215 of the first semiconductor chip 210.

The second semiconductor chip 220 may include therein a first inner capacitor Cap1 and a second inner capacitor Cap2. Although not shown, a first terminal of the first inner capacitor Cap1 may be electrically connected to the intermediate ground via 225, and a second terminal of the first inner capacitor Cap1 may be electrically connected to the first intermediate power via 221. An insulation layer may be provided between the first terminal and the second terminal. The first power voltage V1 and the ground voltage Vg may be voltage-noise filtered by the first inner capacitor Cap1, and may then be applied to integrated circuits (not shown) of the second semiconductor chip 220. A first electrode terminal of the second inner capacitor Cap2 may be electrically connected to the intermediate ground via 225, and a second electrode terminal of the second inner capacitor Cap2 may be electrically connected to the second intermediate power via 222. An insulation layer may be provided between the first electrode terminal and the second electrode terminal. The second power voltage V2 and the ground voltage Vg may be voltage-noise filtered by the second inner capacitor Cap2, and may then be applied to the integrated circuits of the second semiconductor chip 220.

The second semiconductor chip 220 may act as a memory chip, but is not limited thereto. The second semiconductor chip 220 may include a plurality of stacked second semiconductor chips. Alternatively, the second semiconductor chip 220 may be provided as single chip. Alternatively, the second semiconductor chip 220 may be omitted altogether. For brevity of description, it will be hereinafter explained an example in which a single second semiconductor chip 220 is provided.

The third semiconductor chip 230 may be disposed on the second semiconductor chip 220. The third semiconductor chip 230 may include a first upper power via 231, a second upper power via 232, and an upper ground via 235. The first upper power via 231, the second upper power via 232, and the upper ground via 235 of the third semiconductor chip 230 may be respectively electrically connected to the first intermediate power via 221, the second intermediate power via 222, and the intermediate ground via 225 of the second semiconductor chip 220. The first power voltage V1, the second power voltage V2, and the ground voltage Vg may be respectively applied to the first upper power via 231, the second upper via 232, and the upper ground via 235 of the third semiconductor chip 230. The first upper power via 231, the second upper power via 232, and the upper ground via 235 of the third semiconductor chip 230 may each include a conductive material such as copper, aluminum, tungsten, titanium, tantalum, or the like or an alloy thereof.

The third semiconductor chip 230 may be provided therein with a first inner capacitor Cap1 and a second inner capacitor Cap2. Although not shown, in the third semiconductor chip 230, a first terminal of the first inner capacitor Cap1 may be electrically connected to the upper ground via 235, and a second terminal of the first inner capacitor Cap1 may be electrically connected to the first upper power via 231. An insulation layer may be provided between the first terminal and the second terminal. The first power voltage V1 and the ground voltage Vg may be voltage-noise filtered by the first inner capacitor Cap1, and may then be applied to integrated circuits (not shown) of the third semiconductor chip 230. A first electrode terminal of the second inner capacitor Cap2 may be electrically connected to the upper ground via 235, and a second electrode terminal of the second inner capacitor Cap2 may be electrically connected to the second upper power via 232. An insulation layer may be provided between the first electrode terminal and the second electrode terminal. The second power voltage V2 and the ground voltage Vg may be voltage-noise filtered by the second inner capacitor Cap2, and may then be applied to the integrated circuits of the third semiconductor chip 230. The third semiconductor chip 230 may act as a memory chip, but is not limited thereto.

The first power pattern 310, the second power pattern 320, and the ground pattern 350 may be provided on the third semiconductor chip 230. The first power pattern 310, the second power pattern 320, and the ground pattern 350 may each include a conductive material. The conductive material may include metal such as copper, aluminum, or the like or an alloy thereof.

The first power pattern 310 may be coupled to the first upper power via 231 of the third semiconductor chip 230. The second power pattern 320 may be coupled to the second upper power via 232 of the third semiconductor chip 230. The first power pattern 310 may be spaced apart and insulated from the second power pattern 320. As illustrated in FIG. 1A, when viewed in plan, the first power pattern 310 may overlap the first upper power via 231 of the third semiconductor chip 230. Likewise, the second power pattern 320 may overlap the second upper power via 232 of the third semiconductor chip 230.

The ground pattern 350 may be provided between the first power pattern 310 and the second power pattern 320. The ground pattern 350 may be spaced apart and electrically insulated from the first and second power patterns 310 and 320. The ground pattern 350 may be coupled to the upper ground via 235 of the third semiconductor chip 230. As illustrated in FIG. 1A, when viewed in plan, the ground pattern 350 may overlap the upper ground via 235 of the third semiconductor chip 230.

The first outer capacitor C1 may be disposed on the third semiconductor chip 230. The first outer capacitor C1 may include a first electrode 410, a second electrode 420, and a dielectric layer 430. The dielectric layer 430 may be disposed between the first electrode 410 and the second electrode 420. The first electrode 410 and the second electrode 420 may each include a conductive material such as metal. The second electrode 420 may be coupled to the first power pattern 310. The first power voltage V1 may be applied to the second electrode 420 through the first power pattern 310 and the first lower power via 211, first intermediate power via 221, and first upper power via 231 of the first semiconductor chip 210, second semiconductor chip 220, and third semiconductor chip 230. The first electrode 410 may be coupled to the ground pattern 350. The ground voltage Vg may be applied to the first electrode 410 through the ground pattern 350 and the lower ground via 215, the intermediate ground via 225, and the upper ground via 235 of the first semiconductor chip 210, the second semiconductor chip 220, and the third semiconductor chip 230. The first outer capacitor C1 may filter voltage noises of the first power voltage V1 and the ground voltage Vg. As the first outer capacitor C1 is disposed on the third semiconductor chip 230, the first outer capacitor C1 may reduce its capacitance limitation. For example, the first outer capacitor C1 may have a capacitance greater than that of the first inner capacitor Cap1. A first capacitor may be formed by the first outer capacitor C1 and the first inner capacitor Cap1 that are connected in parallel to each other. The first capacitor may have opposite ends correspondingly connected to the first power voltage V1 and the ground voltage Vg. The first capacitor may exhibit capacitance the same as a sum of the capacitances of the first outer capacitor C1 and the first inner capacitor Cap1.

As the first outer capacitor C1 is connected to the first inner capacitors Cap1 through the first lower power via 211, the first intermediate power via 221, and the first upper power via 231 and the lower ground via 215, the intermediate ground via 225, and the upper ground via 235, distances between the first outer capacitor C1 and the integrated circuits (not shown) of the first to third semiconductor chips 210 to 230 may be reduced compared to the case that the first outer capacitor C1 is connected through the substrate 100 to the integrated circuits (not shown) of the first to third semiconductor chips 210 to 230. Accordingly, inductance may be reduced between the first outer capacitor C1 and the integrated circuits (not shown) of the first to third semiconductor chips 210 to 230. An inductance reduction between the capacitors may enhance power integrity of the semiconductor package 1.

The second outer capacitor C2 may be disposed on the third semiconductor chip 230. The second outer capacitor C2 may filter voltage noises of the second power voltage V2 and the ground voltage Vg. The second outer capacitor C2 may include a first electrode pattern 510, a second electrode pattern 520, and a dielectric pattern 530. The dielectric pattern 530 may be interposed between the first electrode pattern 510 and the second electrode pattern 520. The first electrode pattern 510 and the second electrode pattern 520 may each include a conductive material such as metal. The first electrode pattern 510 of the second outer capacitor C2 may be coupled to the ground pattern 350. The ground voltage Vg may be applied to the first electrode pattern 510. The second electrode pattern 520 of the second outer capacitor C2 may be coupled to the second power pattern 320. The second power voltage V2 may be applied to the second electrode pattern 520 through the second power pattern 320 and the second lower power via 212, the second intermediate power via 222, and the second upper power via 232. The second electrode pattern 520 may be insulated from the second electrode 420 of the first outer capacitor C1.

As the second outer capacitor C2 is connected to the integrated circuits (not shown) of the first to third semiconductor chips 210 to 230 through the second lower power via 212, the second intermediate power via 222, and second upper power via 232 and the lower ground via 215, the intermediate ground via 225, and the upper ground via 235, electrical connection paths may decrease in length between the second outer capacitor C2 and the first to third semiconductor chips 210 to 230. A reduction in length of electrical connection paths may enhance power integrity of the semiconductor package 1.

The second outer capacitor C2 may have a capacitance greater than that of the second inner capacitor Cap2. A second capacitor may be formed by the second outer capacitor C2 and the second inner capacitor Cap2 that are connected in parallel to each other. The second capacitor may have opposite ends correspondingly connected to the second power voltage V2 and the ground voltage Vg. The second capacitor may exhibit capacitance the same as a sum of the capacitances of the second outer capacitor C2 and the second inner capacitor Cap2.

The voltage noise may be rapidly dispersed and filtered with increasing number of capacitors that filter the voltage noise. Power integrity may increase with increasing capacitance of capacitors that filter the voltage noise. The voltage noise may include high-frequency noise. The first and second outer capacitors C1 and C2 may share the ground pattern 350. The ground pattern 350 may be electrically connected to the first inner capacitor Cap1, the first outer capacitor C1, the second inner capacitor Cap2, and the second outer capacitor C2. The ground pattern 350 may act to merge the first inner capacitor Cap1, the first outer capacitor C1, the second inner capacitor Cap2, and the second outer capacitor C2 with one another. For example, the first and second capacitors may be merged with each other. As such, the capacitors that filter the voltage noise may have increased capacitances. In some embodiments, not only the first capacitor but also the second capacitor may filter voltage noises of the first power voltage V1 and the ground voltage Vg. Not only the second capacitor but also the first capacitor may filter voltage noises of the second power voltage V2 and the ground voltage Vg. Therefore, the voltage noise may be rapidly dispersed and filtered by the first and second capacitors. In conclusion, the semiconductor package 1 may increase in power integrity.

As the ground pattern 350 is disposed on the third semiconductor chip 230, an electrical path may decrease in length between the first outer capacitor C1 and the second outer capacitor C2. As a result, inductance may be reduced between the first outer capacitor C1 and the second outer capacitor C2.

As illustrated in FIG. 1A, a plurality of first outer capacitors C1 may be provided, and the first outer capacitors C1 may be connected in parallel to each other. Likewise, a plurality of second outer capacitors C2 may be provided, and the second outer capacitors C2 may be connected in parallel to each other. The first and second capacitors may increase in capacitance, and as a result the semiconductor package 1 may further increase in power integrity. For brevity of description, it will be described hereinafter an example including a single first outer capacitor C1 and a single second outer capacitor C2.

Although the ground pattern 350 is illustrated to come into direct contact with the first electrode 410 and the first electrode pattern 510, an interposer (not shown) may be interposed between the ground pattern 350 and the first electrode 410 and between the ground pattern 350 and the first electrode pattern 510. Interconnection terminals 800 may be interposed between the first semiconductor chip 210, the second semiconductor chip 220, and the third semiconductor chip 230 and between the first semiconductor chip 210 and the substrate 100. The interconnection terminals 800 may electrically connect the first semiconductor chip 210, the second semiconductor chip 220, and the third semiconductor chip 230 to each other. The interposers and the interconnection terminals 800 may include bumps, solders, or pillars. The first semiconductor chip 210, the second semiconductor chip 220, and the third semiconductor chip 230 may include corresponding lower signal via 217, intermediate signal via 227, and upper signal via 237, which will be discussed below with reference to FIG. 1C.

The first semiconductor chip 210 may include a lower signal via 217 that acts as an electrical signal path between the signal terminal 107 and the second semiconductor chip 220. The first semiconductor chip 210 may be configured such that the lower signal via 217 may be insulated from the first lower power via 211, the second lower power via 212, and the lower ground via 215. The second semiconductor chip 220 may include an intermediate signal via 227 electrically connected to both the signal terminal 107 and the lower signal via 217 of the first semiconductor chip 210. The second semiconductor chip 220 may be configured such that the intermediate signal via 227 may be insulated from the first intermediate power via 221, the second intermediate power via 222, and the intermediate ground via 225.

The third semiconductor chip 230 may be an uppermost semiconductor chip. The third semiconductor chip 230 may include no lower signal via 217. The third semiconductor chip 230 may be configured such that its integrated circuits (not shown) may be provided closer to a bottom surface 230a. The bottom surface 230a of the third semiconductor chip 230 may face the second semiconductor chip 220. The bottom surface 230a of the third semiconductor chip 230 may act as an active surface. Electrical signals from the integrated circuits of the third semiconductor chip 230 may be transmitted to the signal terminal 107 through the intermediate signal via 227 of the second semiconductor chip 220 and the lower signal via 217 of the first semiconductor chip 210. Accordingly, an electrical signal may be communicated between the third semiconductor chip 230 and an external device (not shown).

Figure 1D:
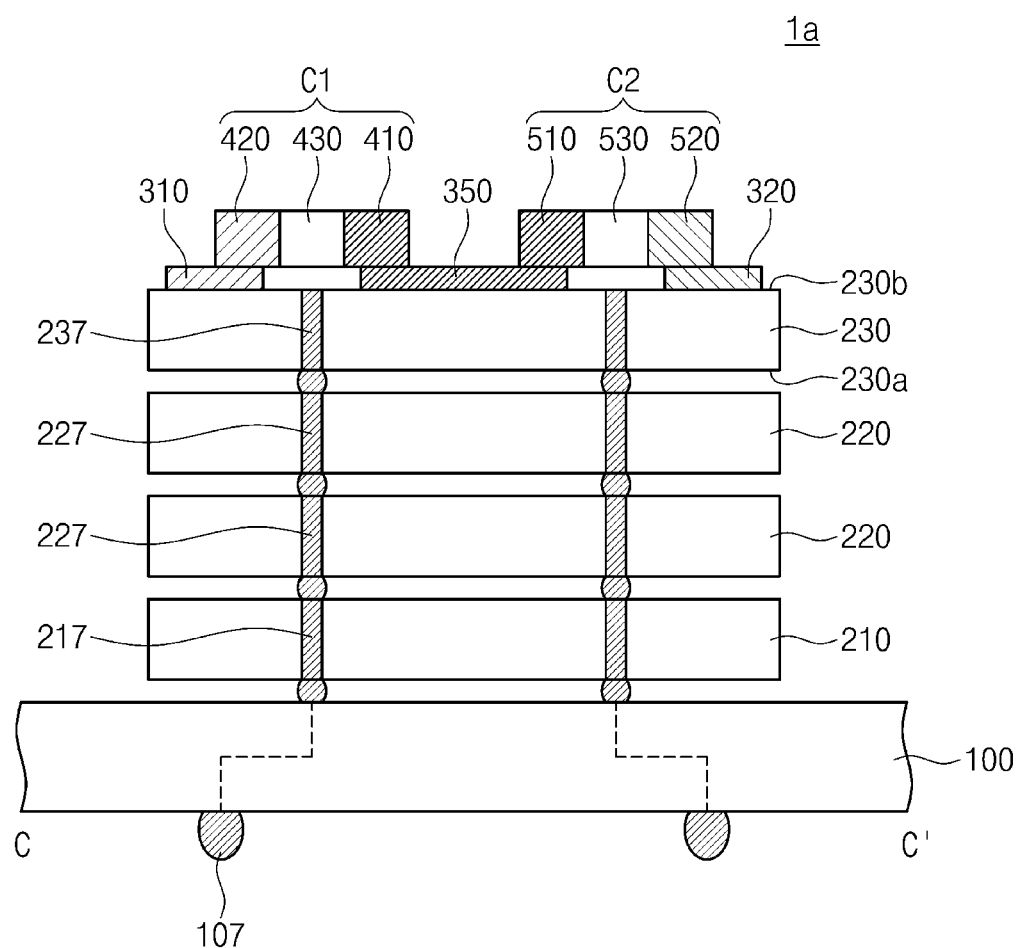
FIG. 1D illustrates a cross-sectional view showing a semiconductor package according to an exemplary embodiment of the present inventive concept.

FIG. 1D illustrates a cross-sectional corresponding to line C-C' of FIG. 1A, showing a semiconductor package according to an exemplary embodiment of the present inventive concept. Duplicate description of the aforementioned will be hereinafter omitted.

Referring to FIG. 1D, a semiconductor package 1a may include a substrate 100, a first semiconductor chip 210, a second semiconductor chip 220, a third semiconductor chip 230, a first outer capacitor C1, a second outer capacitor C2, and a ground pattern 350. The substrate 100, the first outer capacitor C1, the second outer capacitor C2, and the ground pattern 350 may be respectively the same as the substrate 100, the first outer capacitor C1, the second outer capacitor C2, and the ground pattern 350 shown in FIGS. 1A to 1C. A signal terminal 107, a first semiconductor chip 210, and a second semiconductor chip 220 may be respectively the same as the signal terminal 107, the first semiconductor chip 210, and the second semiconductor chip 220 shown in FIGS. 1A to 1C. The third semiconductor chip 230 may include an upper signal via 237. The third semiconductor chip 230 may be configured such that its integrated circuits (not shown) may be provided closer to a top surface 230b. The upper signal via 237 may be coupled to the integrated circuits of the third semiconductor chip 230. The upper signal via 237 of the third semiconductor chip 230 may be coupled to the intermediate signal via 227 of the second semiconductor chip 220. An electrical signal from the third semiconductor chip 230 may be transmitted to the signal terminal 107 through the upper signal via 237 of the third semiconductor chip 230. Accordingly, an electrical signal may be input into and output from the third semiconductor chip 230. The upper signal via 237 of the third semiconductor chip 230 may be insulated from the first power pattern 310, the second power pattern 320, and the ground pattern 350.

Although not shown, as discussed in FIG. 1B, the third semiconductor chip 230 may include a first upper power via 231, a second upper power via 232, and an upper ground via 235.

Figure 2A:
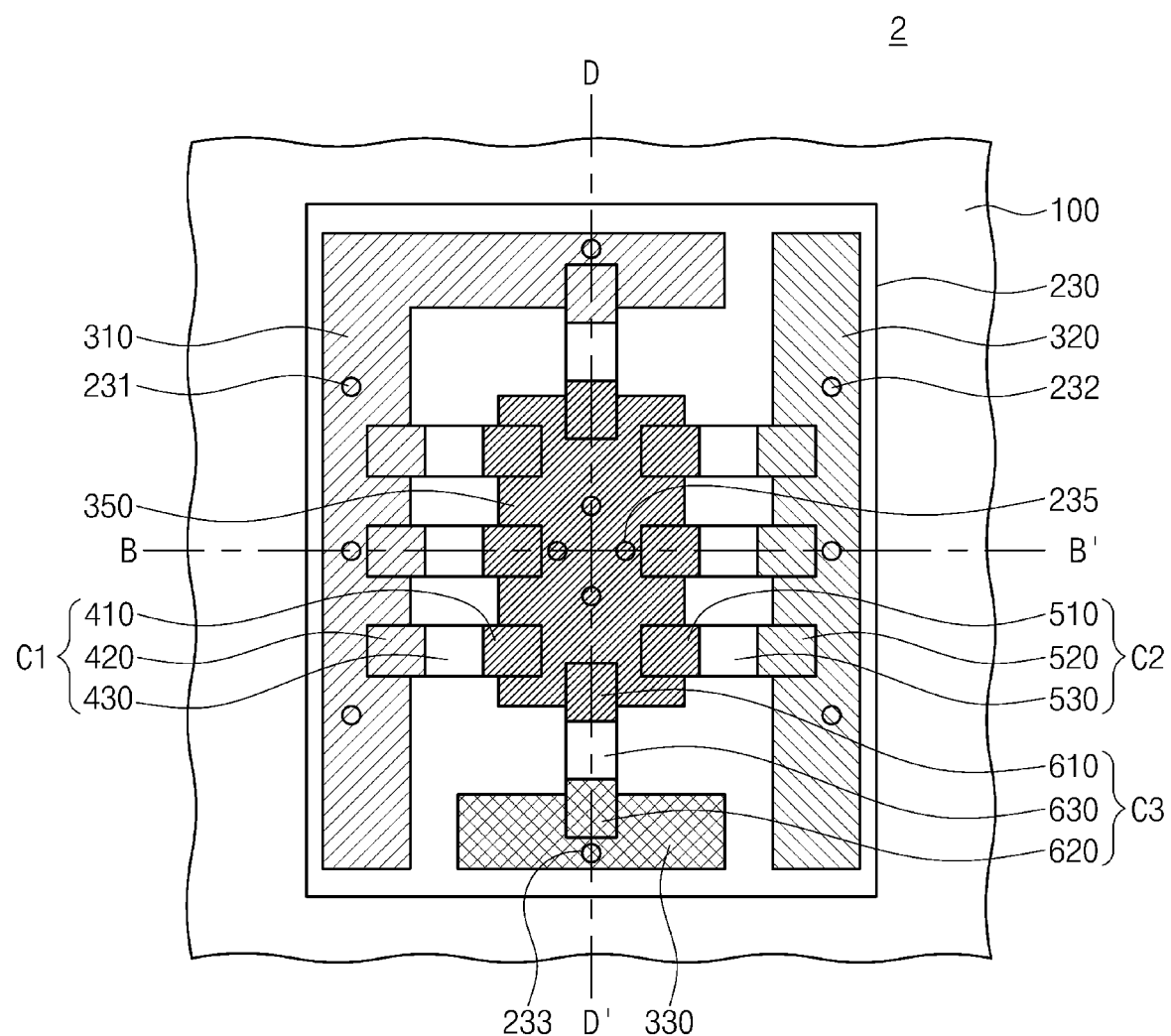
FIG. 2A illustrates a plan view showing a semiconductor package according to an exemplary embodiment of the present inventive concept.
Figure 2B:
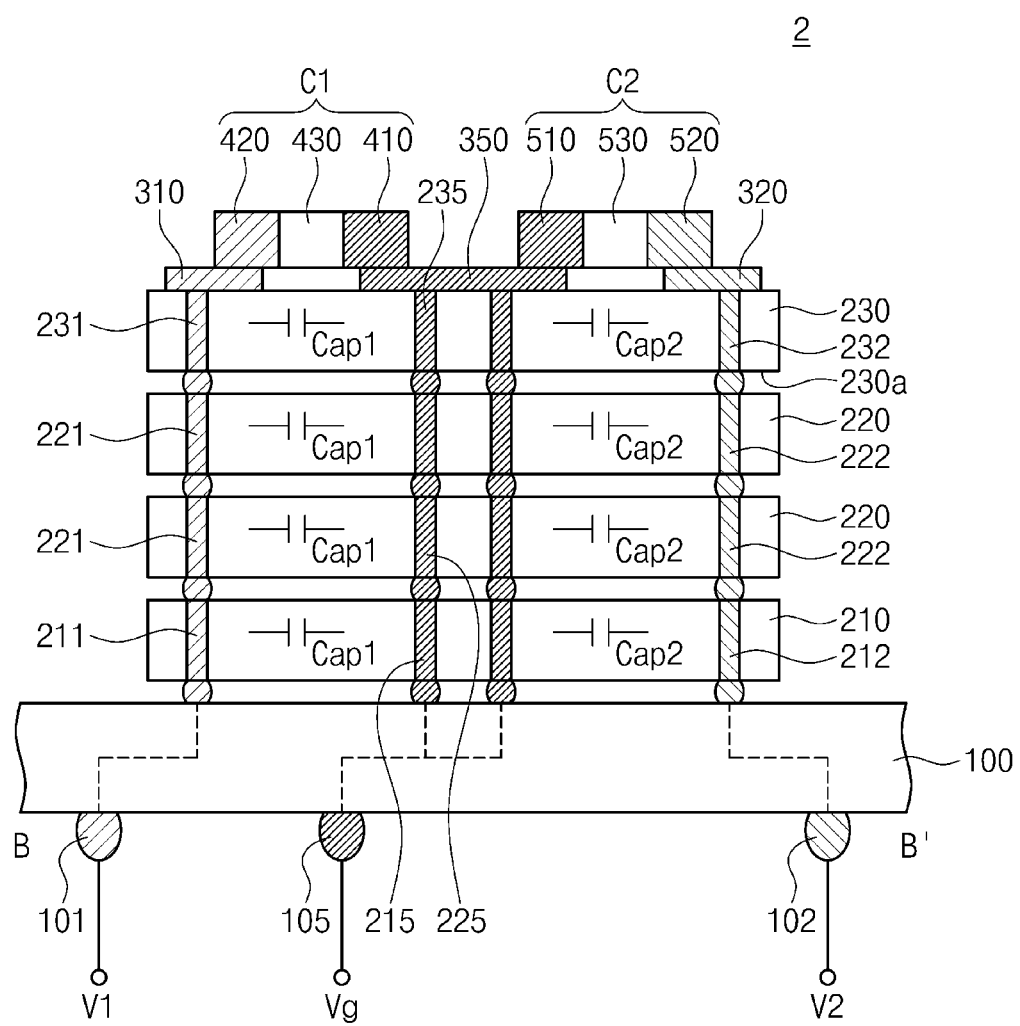
FIG. 2B illustrates a cross-sectional view taken along line B-B' of FIG. 2A.
Figure 2C:
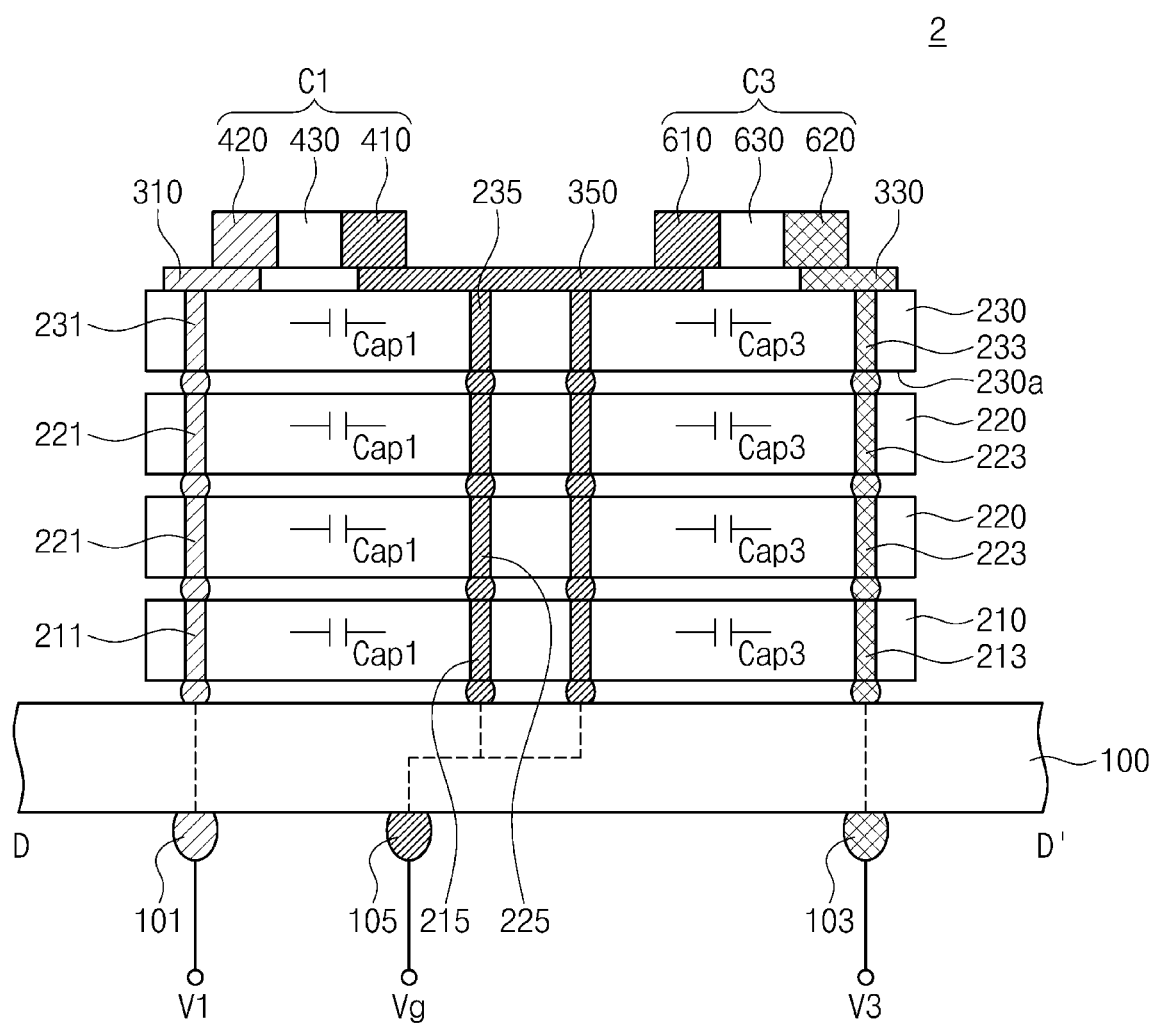
FIG. 2C illustrates a cross-sectional view taken along line D-D' of FIG. 2A.

FIG. 2A illustrates a plan view showing a semiconductor package according to an exemplary embodiment of the present inventive concept. FIG. 2B illustrates a cross-sectional view taken along line B-B' of FIG. 2A. FIG. 2C illustrates a cross-sectional view taken along line D-D' of FIG. 2A. Duplicate description with the aforementioned will be hereinafter omitted.

Referring to FIGS. 2A, 2B, and 2C, a semiconductor package 2 may include a substrate 100, a first semiconductor chip 210, a second semiconductor chip 220, a third semiconductor chip 230, a first power pattern 310, a second power pattern 320, a ground pattern 350, a first outer capacitor C1, and a second outer capacitor C2, and may further include a third power pattern 330 and a third outer capacitor C3. The substrate 100 may be provided thereon with a ground terminal 105, a first power terminal 101, a second power terminal 102, and a third power terminal 103. As illustrated in FIG. 2C, a third power voltage V3 may be applied to the third power terminal 103. The third power voltage V3 may be different from both a first power voltage V1 applied to the first power terminal 101 and a second power voltage V2 applied to the second power terminal 102. The third power voltage V3 may be a reference voltage. The first semiconductor chip 210 may include a first lower power via 211, a second lower power via 212, and a lower ground via 215, and may further include a third lower power via 213. The second semiconductor chip 220 may include a first intermediate power via 221, a second intermediate power via 222, and an intermediate ground via 225, and may further include a third intermediate power via 223. The third semiconductor chip 230 may include a first upper power via 231, a second upper power via 232, and an upper ground via 235, and may further include a third upper power via 233. The first lower power via 211, the first intermediate power via 221, and the first upper power via 231, the second lower power via 212, second intermediate power via 222, and first upper power via 231, and the lower ground via 215, the intermediate ground via 225, and the upper ground via 235 of the first semiconductor chip 210, the second semiconductor chip 220, and the third semiconductor chip 230 may be the same as those discussed in FIGS. 1A and 1B. The third lower power via 213, third intermediate power via 223, and third upper power via 233 of the first semiconductor chip 210, the second semiconductor chip 220, and the third semiconductor chip 230 may each include a conductive material.

The third power voltage V3 may, as illustrated in FIG. 2C, be supplied through the third power terminal 103 to the first semiconductor chip 210, the second semiconductor chip 220, and the third semiconductor chip 230. A third inner capacitor Cap3 may be provided in each of the first semiconductor chip 210, the second semiconductor chip 220, and the third semiconductor chip 230. The third inner capacitor Cap3 may have opposite ends one of which is connected to a corresponding one of the lower ground via 215, the intermediate ground via 225, and the upper ground via 235 and the other of which is connected to a corresponding one of the third lower power via 213, the third intermediate power via 223, and the third upper power via 233 of the first semiconductor chip 210, the second semiconductor chip 220, and the third semiconductor chip 230. The third inner capacitor Cap3 may further include a dielectric layer, which is provided between the opposite ends of the third inner capacitor Cap3. The third inner capacitor Cap3 may filter voltage noises of the third power voltage V3 and the ground voltage Vg.

The third outer capacitor C3 may be disposed on the third semiconductor chip 230. The third outer capacitor C3 may include a first electrode part 610, a second electrode part 620, and a dielectric part 630. The first electrode part 610 and the second electrode part 620 may each include a conductive material such as metal. The dielectric part 630 may be disposed between the first electrode part 610 and the second electrode part 620. The second electrode part 620 may be coupled to the third power pattern 330, and may thus be applied to the third power voltage V3. The first electrode part 610 may be electrically coupled to the ground pattern 350. The ground voltage Vg may be applied to the first electrode part 610.

A third capacitor may be formed by the third outer capacitor C3 and the third inner capacitor Cap3 that are connected in parallel to each other. The third capacitor may filter voltage noises of the third power voltage V3 and the ground voltage Vg. The third outer capacitor C3 may be electrically connected through the ground pattern 350 to the first and second outer capacitors C1 and C2. Accordingly, the semiconductor package 2 may increase in power integrity. Although only a single third outer capacitor C3 has been described, it will be appreciated that multiple third outer capacitors C3 may be provided.

Although not shown, as discussed in FIG. 1C, the first semiconductor chip 210 may include a lower signal via 217, and the second semiconductor chip 220 may include an intermediate signal via 227. In contrast, the third semiconductor chip 230 may include no upper signal via 237. Alternatively, as shown in FIG. 1D, the third semiconductor chip 230 may further include the upper signal via 237.

Figure 3A:
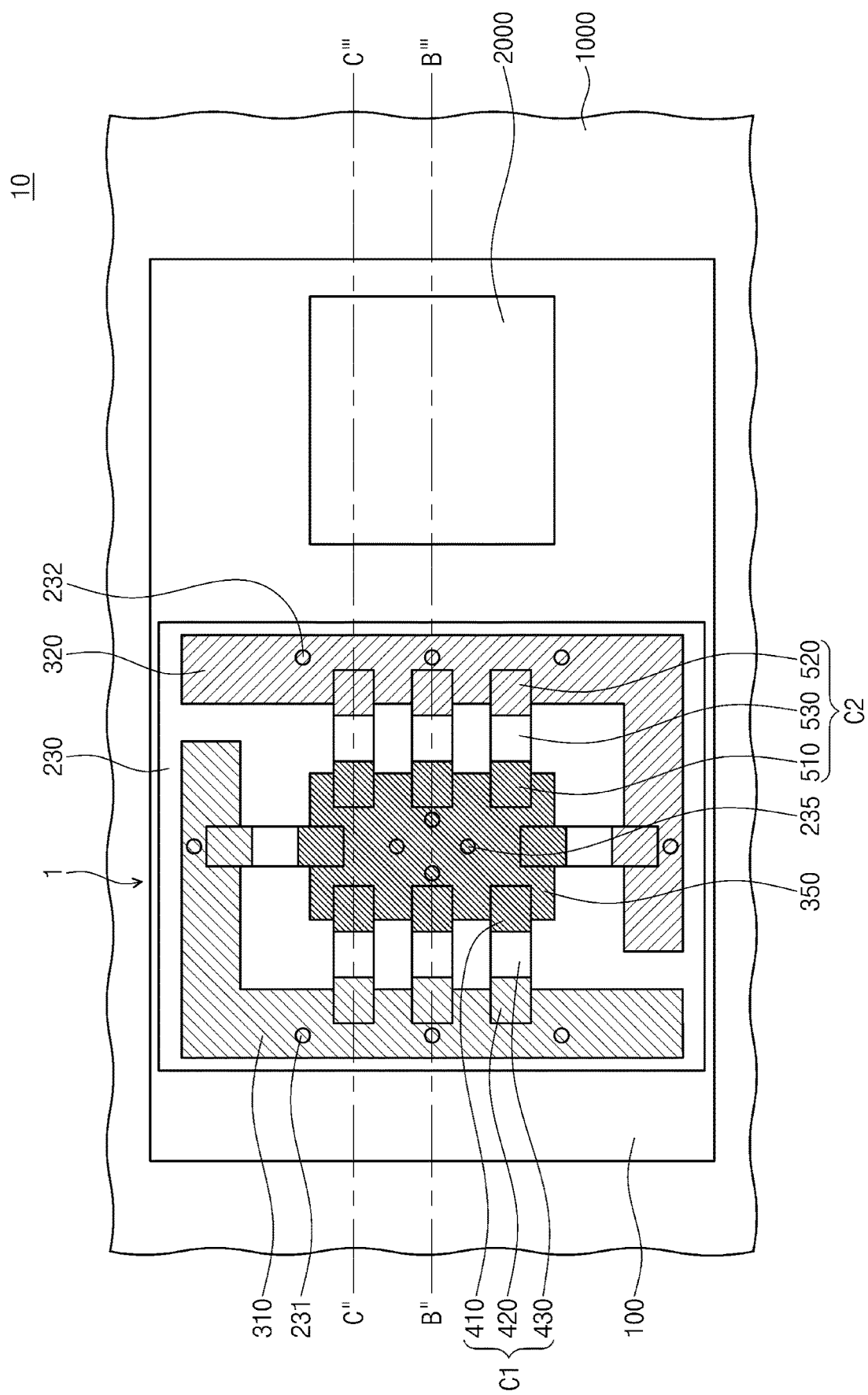
FIG. 3A illustrates a plan view showing a semiconductor module according to an exemplary embodiment of the present inventive concept.
Figure 3B:
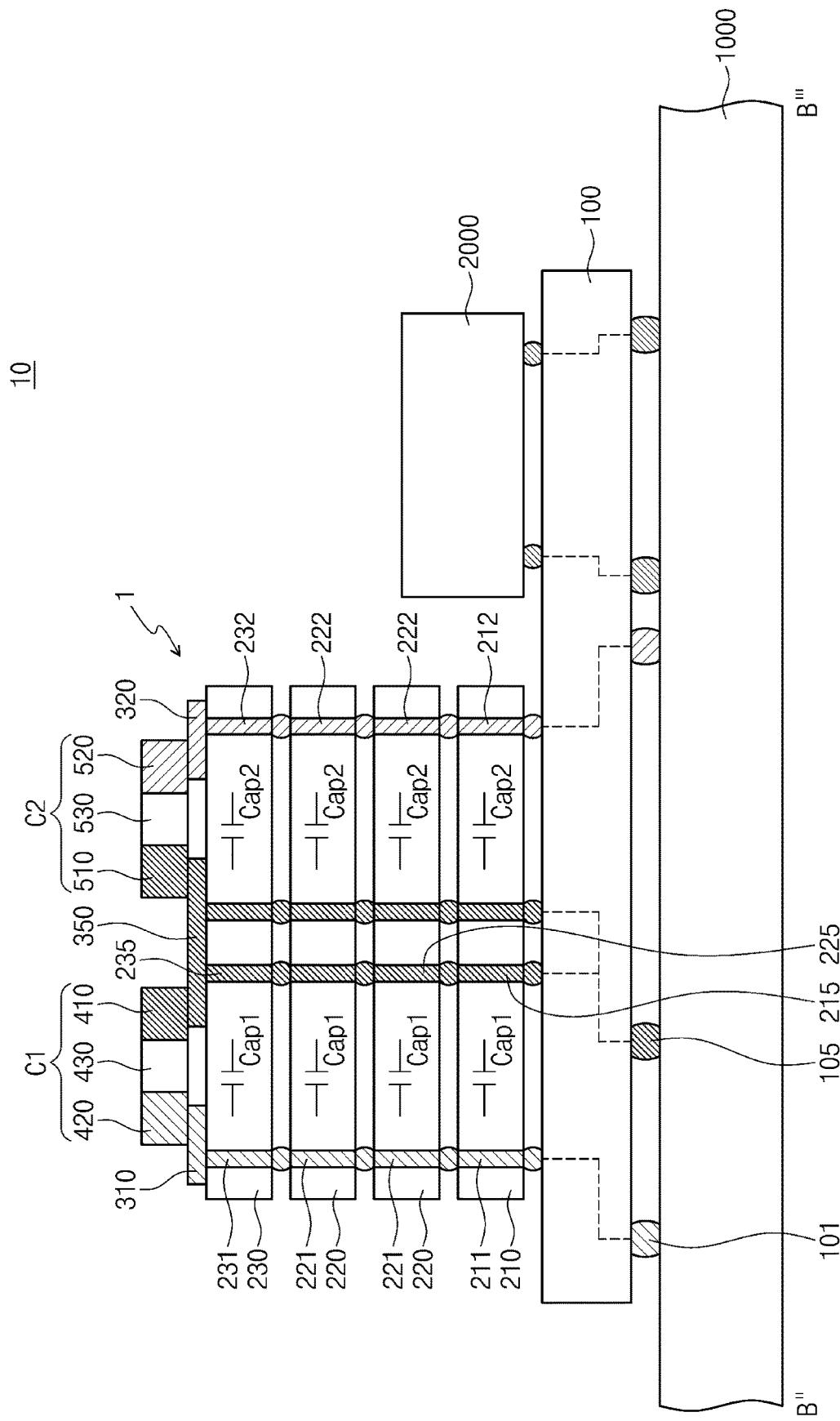
FIG. 3B illustrates a cross-sectional view taken along line B"-B'" of FIG. 3A.
Figure 3C:
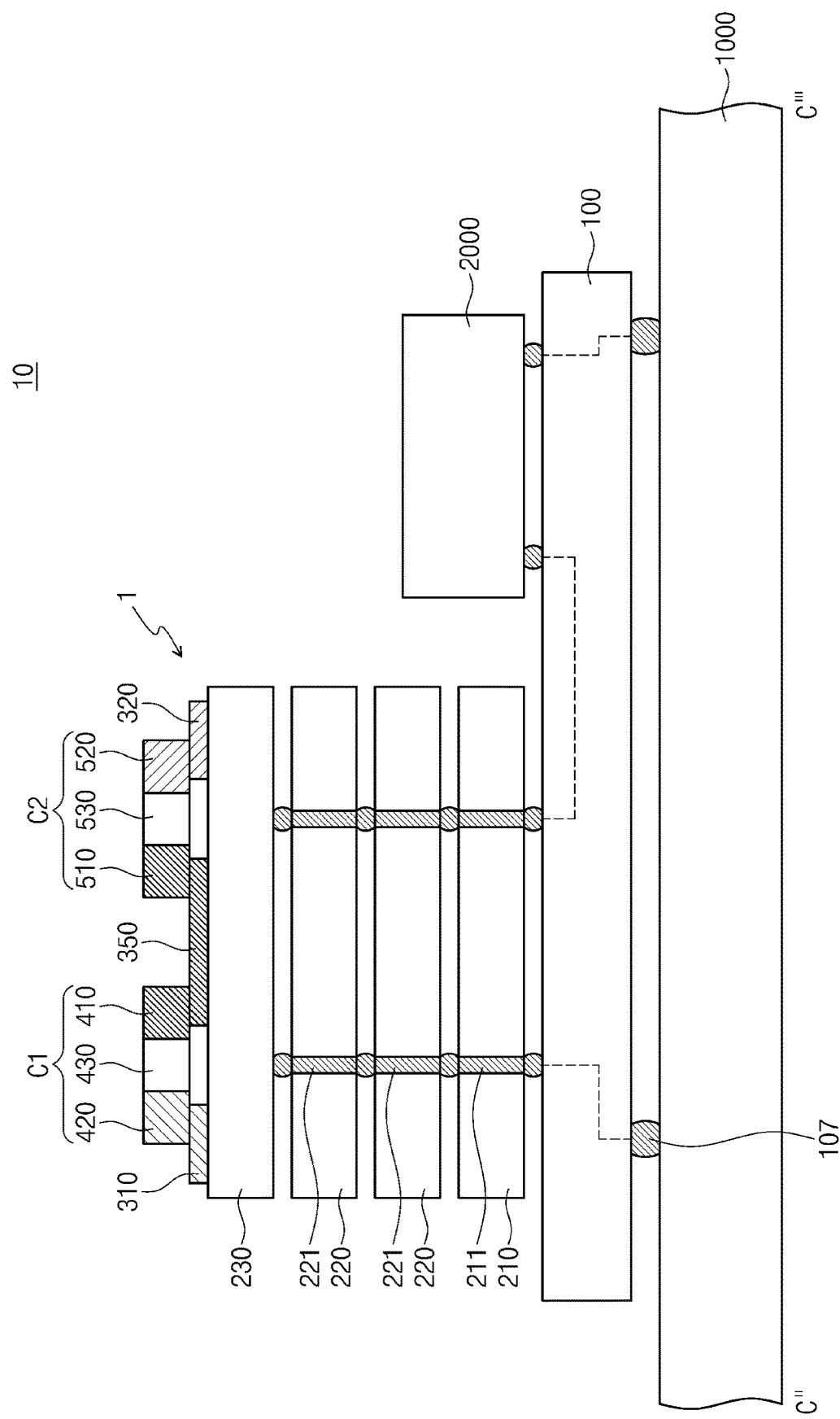
FIG. 3C illustrates a cross-sectional view taken along line C"-C'" of FIG. 3A.

FIG. 3A illustrates a plan view showing a semiconductor module according to an exemplary embodiment of the present inventive concept. FIG. 3B illustrates a cross-sectional view taken along line B"-B'" of FIG. 3A. FIG. 3C illustrates a cross-sectional view taken along line C"-C'" of FIG. 3A. Duplicate description with the aforementioned will be hereinafter omitted.

Referring to FIGS. 3A to 3C, a semiconductor module 10 may include a module substrate 1000, a semiconductor package 1, and an electronic device 2000. The module substrate 1000 may include a printed circuit board (PCB). The semiconductor package 1 may be mounted on the module substrate 1000. The semiconductor package 1 may be the same as that the semiconductor package 1 discussed in FIGS. 1A to 1C. For example, the semiconductor package 1 may include a substrate 100, first semiconductor chip 210, second semiconductor chip 220, third semiconductor chip 230, a first power pattern 310, a second power pattern 320, a ground pattern 350, a first outer capacitor C1, and a second outer capacitor C2.

The electronic device 2000 may be mounted on the substrate 100. The electronic device 2000 may be disposed laterally spaced apart from the first semiconductor chip 210, the second semiconductor chip 220, and the third semiconductor chip 230. As shown in dotted lines in FIG. 3C, the electronic device 2000 may be electrically connected through the substrate 100 to the first semiconductor chip 210, the second semiconductor chip 220, and the third semiconductor chip 230. The electronic device 2000 may include a central processing unit (CPU), a graphic processing unit (GPU) or the like.

Alternatively, the semiconductor package 2 shown in FIGS. 2A to 2C may be mounted on the module substrate 1000, which may manufacture the semiconductor module 10. Dissimilarly, as shown in FIG. 1D, the third semiconductor chip 230 may further include the upper signal via 237.

According to exemplary embodiments disclosed herein, the first outer capacitor may be electrically connected through the ground pattern to the second outer capacitor. The first and second outer capacitors may each filter voltage noises of the first power voltage, the ground voltage, and the second power voltage. As a result, the semiconductor package may increase in power integrity.

This detailed description of the present inventive concept should not be construed as limited to the embodiments set forth herein, and it is intended that the present inventive concept covers the various combinations, the modifications and variations of this invention without departing from the spirit and scope of the invention. The appended claims should be construed to include other embodiments.

What is claimed is:

1. A semiconductor package, comprising:
a semiconductor chip having a center region and an edge region surrounding the center region in a plan view;
a first power pattern on an upper surface of the edge region of the semiconductor chip;
a second power pattern on the upper surface of the edge region of the semiconductor chip and spaced apart from the first power pattern;
a ground pattern on the upper surface of the center region of the semiconductor chip and spaced apart from the first power pattern and the second power pattern;
a third power pattern on the upper surface of the edge region of the semiconductor chip and spaced apart from the first power pattern, the second power pattern, and the ground pattern;
a plurality of first outer capacitors on the semiconductor chip, each of the first outer capacitors comprising:
a first ground electrode overlapped with and electrically connected to the ground pattern; and
a first power electrode overlapped with and electrically connected to the first power pattern;
a second outer capacitor on the semiconductor chip, the second outer capacitor comprising:
a second ground electrode overlapped with and electrically connected to the ground pattern; and
a second power electrode overlapped with and electrically connected to the second power pattern; and
a third outer capacitor comprising a third power electrode overlapped with the third power pattern and a third ground electrode in electrical contact with the ground pattern.

2. The semiconductor package of claim 1, wherein the second outer capacitor is one of a plurality of second outer capacitors, each of the second outer capacitors overlapped with and electrically connected to the second power pattern and the ground pattern.

3. The semiconductor package of claim 1, wherein the semiconductor chip comprises:
a ground via electrically connected the ground pattern;
a first power via electrically connected to the first power pattern; and
a second power via electrically connected to the second power pattern.

4. The semiconductor package of claim 1, wherein the second outer capacitor does not overlap with the first power pattern in the plan view.

5. The semiconductor package of claim 1, wherein the first power pattern is configured to apply a power voltage different from those of the second power pattern.

6. The semiconductor package of claim 1, wherein the second power electrode is insulated from the first power electrode.

7. The semiconductor package of claim 1, further comprising: a substrate; and a plurality of stacked lower semiconductor chips disposed between the substrate and the semiconductor chip.

8. A semiconductor package, comprising:
a semiconductor chip; a ground pattern on an upper surface of the semiconductor chip;
a first power pattern laterally spaced apart from the ground pattern on the upper surface of the semiconductor chip;
a second power pattern on the semiconductor chip and laterally spaced apart from the first power pattern and the ground pattern; and
a plurality of outer capacitors spaced apart from each other, each of the outer capacitors comprising a power electrode and a ground electrode,
wherein the outer capacitors comprise a plurality of first outer capacitors and a plurality of second outer capacitors,
wherein the ground electrode of each of the first outer capacitors and the second outer capacitors are disposed on and electrically connected to the ground pattern,
wherein the power electrode of each of the first outer capacitors are disposed on and electrically connected to the first power pattern,
wherein the power electrode of each of the second outer capacitors are not overlapped with the first power pattern in plan view, and
wherein the semiconductor package further comprises:
a third power pattern spaced apart from the first outer capacitors and the second outer capacitors and disposed on the upper surface of the semiconductor chip; and
a third outer capacitor electrically connected to the third power pattern and the ground pattern,
wherein the ground pattern is disposed between the first power pattern and the second power pattern along a first direction, the first direction being parallel to the upper surface of the semiconductor chip,
wherein the ground pattern is disposed between the first power pattern and the third power pattern along a second direction,
wherein the second direction is parallel to the upper surface of the semiconductor chip and different from the first direction, wherein the first power pattern is configured to apply a first power voltage,
wherein the second power pattern is configured to apply a second power voltage different from first power voltage, and
wherein the third power pattern is configured to apply a third power voltage to different from the first power voltage and the second power voltage.

9. The semiconductor package of claim 8, wherein the power electrode of each of the second outer capacitors are disposed on and electrically connected to the second power pattern.

10. The semiconductor package of claim 9, wherein the ground pattern is disposed between the first power pattern and the second power pattern in the plan view.

11. The semiconductor package of claim 9, wherein the second power pattern is insulated from the first power pattern.

12. The semiconductor package of claim 8, wherein the semiconductor chip having a center region and an edge region surrounding the center region in the plan view,
wherein the first power pattern, the second power pattern, the third power pattern are overlapped with the edge region of the semiconductor chip, and
wherein the ground pattern is overlapped with the center region of the semiconductor chip.

13. A semiconductor package, comprising:
a semiconductor chip, wherein the semiconductor chip comprises a center region and an edge region surrounding the center region in a plan view;
a first metal layer, a second metal layer and a third metal layer on the semiconductor chip and laterally spaced apart from each other;
a conductive layer on the semiconductor chip and laterally spaced apart from the first metal layer, the second metal layer and the third metal layer;
a first outer capacitor comprising a first terminal on and electrically connected to the first metal layer and a second terminal on and electrically connected to the conductive layer; and
a plurality of second outer capacitors, each of the second outer capacitors comprising a third terminal on and electrically connected to the second metal layer and a fourth terminal on and electrically connected to the conductive layer,
wherein the conductive layer is overlapped with the center region of the semiconductor chip, and
wherein the first metal layer, the second metal layer and the third metal layer are overlapped with the edge region of the semiconductor chip such that the conductive layer is disposed between the first metal layer and the second metal layer along a first direction in the plan view and such that the conductive layer is disposed between the first metal layer and the third metal layer along a second direction, which is different from the first direction in the plan view.

14. The semiconductor package of claim 13, wherein the first outer capacitor is one of a plurality of first outer capacitors, each of the first outer capacitors overlapped with and electrically connected to the first metal layer and the conductive layer.

15. The semiconductor package of claim 13, wherein the conductive layer is configured to apply a ground voltage,
wherein the first metal layer is configured to apply a first power voltage, and
wherein the second metal layer is configured to apply a second power voltage different from the first power voltage.

16. The semiconductor package of claim 13, wherein the semiconductor chip comprises:
a ground via overlapped with the conductive layer;
a first power via overlapped with the first metal layer; and
a second power via overlapped with the second metal layer.

17. The semiconductor package of claim 13, wherein the second outer capacitors are laterally spaced apart from the first metal layer in the plan view.

18. The semiconductor package of claim 1, wherein the first power pattern is configured to apply a first power voltage,
wherein the second power pattern is configured to apply a second power voltage different from first power voltage, and
wherein the third power pattern is configured to apply a third power voltage to different from the first power voltage and the second power voltage.

19. The semiconductor package of claim 1, wherein the ground pattern is disposed between the first power pattern and the second power pattern along a first direction, the first direction parallel to the upper surface of the semiconductor chip,
wherein the ground pattern is disposed between the first power pattern and the third power pattern along a second direction, and
wherein the second direction is parallel to the upper surface of the semiconductor chip and different from the first direction.

* * * * *